United States Patent [19]

Pinneo

[11] Patent Number: 4,849,199

[45] Date of Patent: Jul. 18, 1989

[54] METHOD FOR SUPPRESSING GROWTH OF GRAPHITE AND OTHER NON-DIAMOND CARBON SPECIES DURING FORMATION OF SYNTHETIC DIAMOND

[75] Inventor: John M. Pinneo, Woodside, Calif.

[73] Assignee: Crystallume, Menlo Park, Calif.

[21] Appl. No.: 32,206

[22] Filed: Mar. 30, 1987

[51] Int. Cl.$^4$ .................................. B01J 3/06
[52] U.S. Cl. ........................... 423/446; 156/DIG. 68; 204/113; 427/39
[58] Field of Search ............... 423/446; 156/DIG. 68; 427/39, 113; 204/173

[56] References Cited

U.S. PATENT DOCUMENTS

| | | | |
|---|---|---|---|
| 3,030,187 | 4/1962 | Eversole | 423/446 |
| 3,030,188 | 4/1962 | Eversole | 423/446 |
| 3,142,539 | 7/1964 | Brinkman et al. | 423/446 |
| 3,175,885 | 3/1965 | Brinkman et al. | 423/446 |
| 3,371,996 | 3/1968 | Hibschman | 423/446 |
| 3,630,678 | 12/1971 | Gardener | 423/446 |
| 3,630,679 | 12/1971 | Angus | 423/446 |
| 3,705,937 | 12/1972 | Dzevitsky | 423/446 |
| 3,714,334 | 7/1973 | Vickery | 423/446 |
| 3,961,103 | 6/1976 | Aisenberg | 423/446 |
| 4,104,441 | 8/1978 | Fedoseev et al. | 423/446 |
| 4,352,787 | 10/1982 | French et al. | 423/446 |
| 4,434,188 | 2/1984 | Kamo et al. | 427/39 |
| 4,490,229 | 12/1984 | Mirtich et al. | 423/446 |
| 4,495,044 | 1/1985 | Banks | 423/446 |
| 4,504,519 | 3/1985 | Zelez | 421/39 |

FOREIGN PATENT DOCUMENTS

| | | | |
|---|---|---|---|
| 0175980 | 4/1986 | European Pat. Off. | 427/39 |
| 60-180999 | 9/1985 | Japan | 423/446 |
| 1008618 | 10/1965 | United Kingdom | 156/DIG. 68 |

OTHER PUBLICATIONS

Patel et al., Indian Journal of Pure & Applied Physics, vol. 19, pp. 803–820 (Sep. 1981).

Burton, Nature, Aug. 24, 1905, p. 397.

*Primary Examiner*—John Doll
*Assistant Examiner*—Robert M. Kunemund
*Attorney, Agent, or Firm*—Flehr, Hohbach, Test, Albritton & Herbert

[57] ABSTRACT

Methods are provided for suppressing the growth of graphite and other non-diamond carbon species during the low pressure deposition of carbon to form diamond. In one method, the graphite or other non-diamond carbon species is vaporized using incident radiative energy sufficient to vaporize graphite but insufficient to damage the substrate. In another embodiment the graphite or other non-diamond carbon species is selectively photolyzed, such as, by use of laser energy of appropriate wavelength.

3 Claims, No Drawings

METHOD FOR SUPPRESSING GROWTH OF GRAPHITE AND OTHER NON-DIAMOND CARBON SPECIES DURING FORMATION OF SYNTHETIC DIAMOND

The present invention is directed to a method for suppressing growth of graphite and other non-diamond carbon species during low pressure metastable diamond deposition.

BACKGROUND OF THE INVENTION

Diamond is an allotrope of carbon which is metastable at ordinary pressures, having a large activation energy barrier which prevents conversion to graphite, which is the more stable allotrope at ordinary temperatures and pressures. In addition to its value as a precious gem, the uses of diamond include many industrial applications such as use in polishing, grinding, sawing and drilling, as windows in high pressure cells, in diamond microtone knives for biological and medicinal uses, as a radiation detector, for temperature measurement, as heat sinks, as wire drawing dyes, styli for photographs and as hardness indenters. Thus numerous approaches have been utilized to attempt to synthesize diamond.

One approach is to utilize high pressure methods since at high pressures diamond, rather than graphite, is the thermodynamically stable form of carbon. However, heretofore, high pressure methods have met only with limited commercial success since only small diamond crystals have been made, which are suitable mainly for use as abrasives and in forming sintered preforms for use as wire drawing dyes or tool bits. Moreover, the product of high pressure diamond synthesis is often contaminated with impurities of more or less uncontrollable concentration and distribution, rendering such diamond unsuitable for a number of important technical applications.

There have been attempts to grow diamond under low pressure conditions which, at first impression, may seem to be against thermodynamic principles. However, upon crystallization at low pressures using free carbon atoms, the free carbon atoms, during their fall from a state of higher free energy, may be made to pause (i.e. crystallize) at the level of diamond, instead of going to graphite. Therefore free carbon atoms with a higher free energy than that in diamond may be made to crystallize as diamond under suitable conditions, thus the metastability of diamond alone is not a deterrent factor of obtaining diamond at atmospheric or reduced pressure. Moreover, metastable phases, such as diamond, may be made to grow in the stability field of another phase, when nucleation and growth is facilitated by providing seeds of the required phase or a substrate which allows epitaxial overgrowth. Thus there are numerous techniques utilizing low pressure epitaxial crystallization of diamond. However, these gas phase synthesis techniques suffer from the problems of extremely low growth rates and/or the inevitable problem of interruption of growth due to formation of graphite. Once the graphite is formed, being the favored thermodynamic product at low pressure, it overtakes and inhibits further diamond growth. In order to maximize the time available for diamond growth before the appearance of graphite, the vapor pressure of the carbon bearing gas has been usually kept quite low, thus leading to very slow diamond deposition rates, typically about 0.1 micron/hour.

Another approach for diamond synthesis has been use of low pressure liquid phase synthesis. Liquid phase synthesis however has not as yet permitted synthesis of large, high quality diamond crystals and the products have been limited to microscopic deposits of uncertain identity. The commercial utility of liquid phase synthesis has been limited by the same problems which affect low pressure vapor phase synthesis, i.e., failure to exclude poison species (such as water), lack of species which stabilize the carbon $sp^3$ bonds (such as atomic hydrogen), and failure to develop process conditions which form high quality crystals at acceptable rates of growth.

There are many processes known in the art in which diamond is synthesized under high pressure at which diamond is the thermodynamically stable form of carbon. Although there are many variations of this technique, a typical technique involves use of a suitable carbon solvent such as a transition metal alloy, and a carbon source which are compressed and heated in an apparatus capable of providing pressures of at least 60 kilobars at temperatures above 1500° C. The carbon is dissolved, transported, and deposited as diamond crystals but the carbon transport rate is governed primarily by diffusion, and therefore is very low. Thus the growth rates are slow and long deposition times are required to grow large diamonds.

Furthermore because of the high pressures and temperatures required, the apparatus is necessarily bulky and expensive. Furthermore, because of the relatively small active of volume, high pressure deposition precludes effective use of mechanical techniques (such as stirring) which might improve growth rates and product quality.

All of the above methods suffer from the problem of growth of graphite, which eventually causes diamond growth to cease.

It is therefore an object of the present invention to provide a method for low pressure vapor phase metastable diamond synthesis whereby growth of graphite and other non-diamond carbon species is suppressed by evaporation or selective photolysis.

These and other objects of the present invention will be apparent to those skilled in the art from the following description of the preferred embodiments and from the appended claims.

SUMMARY OF THE INVENTION

The present invention provides a method for suppressing growth of graphite and other non-diamond carbon species during growth of diamond by low pressure vapor deposition of carbon upon a substrate, comprising the step of heating the growing diamond surfaces during deposition with incident radiative energy which is sufficient to vaporize graphite and non-diamond carbon species formed upon the surfaces. In another embodiment the growth of graphite and other non-diamond carbon species is suppressed during deposition of diamond by exposing the growing surfaces to incident radiative energy of a wavelength sufficient to selectively photolyze non-diamond carbon-carbon bonds formed at the surface of the growing diamond.

DETAILED DESCRIPTION OF THE PREFERRED EMBODIMENTS

The term diamond in the following context will have its normal meaning, that is, a substantially transparent hard, strong allotrope of carbon consisting of $sp^3$- bonded carbon atoms which thermodynamically stable at elevated pressures. As used herein, the term diamond is also intended to encompass $sp^3$-bonded carbon such as Lonsdaleite, as well as other polytypes and allotypes of carbon which have properties similar to those of $sp^3$-bonded carbon.

According to the present invention, diamond growth is initiated upon diamond seed particles or other appropriate substrates by exposing the seed or substrate to conditions of low pressure diamond deposition, such as, by exposure to a low pressure carbon source gas under conditions typically known in the art as plasma enhanced chemical vapor deposition (PECVD). Low pressure growth of diamonds on seed crystals typically occurs at pressures of about $10^{-2}$ to $10^{-3}$ torr at temperatures ranging from about 800° to 1450° C., such as disclosed in U.S. Pat. Nos. 3,630,678 and 3,030,188. Typical carbon source gases are methane, ethane, and other hydrocarbons such as dichloromethane, chloroform, carbon tetrachloride or acetone. Low pressure PECVD conditions for depositing diamond may also include use of a carbon source gas up to about a pressure of $10^3$ torr and temperatures in the range of 20° to 1000° C.

While virtually every method in the prior art for epitaxial deposit of diamond suffers from the problem of graphite or other non-diamond species formation during the deposition process, this problem is dealt with in most cases by ceasing the deposition process and subjecting the diamond particles to a cleaning operation whereby graphite or other non-diamond species are removed. In many circumstances, the cleaning operation is as long and as difficult as the diamond deposition step itself, thereby prolonging and rendering the entire process relatively inefficient. However, the present invention offers the advantages of removing graphite and other non-diamond carbon species during the deposition process so that the epitaxial growth of diamond may be extended to grow larger diamonds more efficiently and in greater purity.

According to one embodiment of the present invention, the growing diamond surfaces are heated during the deposition process with an incident radiative energy source sufficient to vaporize graphite and non-diamond carbon species as they form upon the growing diamond surface. The energy which will be utilized will be sufficient to vaporize graphite and the non-diamond carbon species but yet be low enough to avoid any substantial physical or chemical damage to the substrate, particularly if the substrate is other than a diamond seed crystal. Energy levels for this process are preferably between about 0.5 to 1000 watts/cm$^2$ and may be provided by any appropriate energy source such as a laser or flashlamp. A particularly preferred value for the incident energy is from 1 to 5 watts/cm$^2$. This amount of energy may be delivered, for instance, by a neodymium-YAG laser radiating at a wavelength of about 1.064 microns, delivered at a pulse repetition rate of around 10 pulses per second with a duration of approximately 2 microseconds per pulse. Also, control of graphite growth over a large diamond crystal or substrate area may be achieved by scanning a tightly focused beam over the entire area or by using a light source capable of providing the necessary power density over the total growth area. In such instances the wavelength of the light is not critical as long as the energy is strongly absorbed by graphitic or non-diamond carbon species and not absorbed or only weakly absorbed by a diamond. Over most optical wavelengths, graphite exhibits an optical absorption coefficient $10^5$ cm$^{-1}$, while diamond exhibits an optical absorption coefficient ranging from 0.1 to 10 cm$^{-1}$. These coefficients produce the large difference in the optical absorption of diamond and graphite. Thus, wavelengths longer than approximately 225 nanometers are sufficient for this purpose and do not significantly affect the underlying diamond crystal.

In a second embodiment of the present invention the growth of the graphite and other non-diamond species during low pressure vapor deposition of diamond is suppressed by selectively photolyzing the $sp^1$ and $sp^2$ bonds (which are non-diamond carbon-carbon bonds) as the non-diamond species are formed at the surface of the growing diamond crystal. For this purpose use of wavelength of shorter than about 225 nanometers is sufficient. The energy required for selective photolysis may be provided by an arc lamp, flashlamp, laser or other suitable energy source, with the laser being the most desirable since it is the most controllable source of radiation. The illumination power densities may range from a few microwatts/cm$^2$ to around 100 watts/cm$^2$, depending upon the specific low pressure deposition conditions utilized. Exemplary wavelengths and emission sources which dissociate graphitic carbon bonds (by single photon absorption) include wavelengths at 157 nanometers (as produced by $F_2$ excimer emission). If sufficient intensities are utilized, multiple photon absorption using longer wavelengths may be utilized such as, 310 nanometers (XeCl excimer emission) and 352 nanometers (XeF excimer emission). Infrared lasers such as neodymium:YAG lasers or carbon dioxide lasers may also be used for multiphoton absorption dissociation of non-diamond carbon bonds.

A particularly preferred set of conditions resulting in the selective dissociation of non-diamond carbon bonds includes use of incident radiative energy of 157 nanometers at a power of 0.1 watt/cm$^2$ to 1 watt/cm$^2$ with a pulse duration from 100 nanoseconds to 1 microsecond at a pulse repetition rate of 5 to 10 pulses per second.

Having described the above preferred embodiments it will be apparent to those skilled in the art that various modifications and alterations may be made without departing from the spirit and scope of the invention, which modifications and alterations are intended to be within the scope of the present invention. The present invention is not deemed to be limited by any of the foregoing description except as described by the following claims.

I claim:

1. A method for suppressing growth of graphite and other non-diamond carbon species during growth of diamond by low pressure vapor deposition of carbon upon a substrate, comprising the step of heating the growing diamond surfaces during deposition with incident radiative energy comprising optical wavelengths sufficiently high to vaporize graphite and other non-diamond carbon species formed upon said surfaces but said flux being sufficiently low to avoid substantial physical and chemical damage to said substrate.

2. A method according to claim 1 wherein said radiative energy is of a magnitude of about 0.5 to 1000 watts/cm$^2$.

3. A method according to claim 2 wherein said energy is in the range of 1 to 5 watts/cm$^2$ and is produced by a pulsed laser.

* * * * *